(12) United States Patent
Huang

(10) Patent No.: US 11,687,290 B1
(45) Date of Patent: Jun. 27, 2023

(54) METHOD FOR IMPROVE READ DISTURBANCE PHENOMENON OF FLASH MEMORY MODULE AND ASSOCIATED FLASH MEMORY CONTROLLER AND ELECTRONIC DEVICE

(71) Applicant: Silicon Motion, Inc., Hsinchu County (TW)

(72) Inventor: Cheng-Hao Huang, Keelung (TW)

(73) Assignee: Silicon Motion, Inc., Hsinchu County (TW)

( * ) Notice: Subject to any disclaimer, the term of this patent is extended or adjusted under 35 U.S.C. 154(b) by 18 days.

(21) Appl. No.: 17/574,579

(22) Filed: Jan. 13, 2022

(51) Int. Cl.
*G06F 12/00* (2006.01)
*G06F 3/06* (2006.01)

(52) U.S. Cl.
CPC .......... *G06F 3/0659* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 2010/0332922 A1* | 12/2010 | Chang | G06F 12/0246 714/763 |
| 2015/0293809 A1* | 10/2015 | Liang | G06F 11/1068 714/704 |
| 2015/0349806 A1* | 12/2015 | Totolos, Jr | G06F 11/073 714/704 |
| 2017/0232983 A1* | 8/2017 | Miglianico | B61L 15/009 701/19 |
| 2020/0285393 A1* | 9/2020 | Lin | G06F 3/0604 |
| 2021/0397562 A1* | 12/2021 | Bhardwaj | G06F 12/0253 |

* cited by examiner

*Primary Examiner* — Daniel D Tsui
(74) *Attorney, Agent, or Firm* — Winston Hsu

(57) ABSTRACT

The present invention provides a control method of a flash memory controller wherein the control method includes the steps of: selecting a first block; reading pages of the first block and determining a bit error rate or a bit error count of each page; for each of the pages, if the bit error rate or the bit error count of the page is not greater than a first threshold value, moving the data of the page into a second block; and for each of the pages, if the bit error rate or the bit error count of the page is greater than the first threshold value, moving the data of the page into a third block; wherein a number of pages corresponding to a word line of the second block is less than a number of pages corresponding to a word line of the third block.

20 Claims, 6 Drawing Sheets

| Block #1 | Read count |
|---|---|
| 310_1 | 512 |
| 310_2 | 0 |
| 310_3 | 723 |
| ⋮ | ⋮ |
| 320_1 | 4000 |
| 320_2 | 0 |
| 320_3 | 0 |
| ⋮ | ⋮ |

METHOD FOR IMPROVE READ DISTURBANCE PHENOMENON OF FLASH MEMORY MODULE AND ASSOCIATED FLASH MEMORY CONTROLLER AND ELECTRONIC DEVICE

BACKGROUND OF THE INVENTION

1. Field of the Invention

The present invention relates to a flash memory controller.

2. Description of the Prior Art

In a flash memory device, if a host device often accesses a specific address of a flash memory device, the flash memory device may suffer read disturbance issue, that is data stored in the memory cells corresponding to the specific address may have lower quality and higher bit error rate. This read disturbance phenomenon is particularly serious for triple-level cell (TLC) blocks and quad-level cell (QLC) blocks of the flash memory device, so if the host device always accesses the specific address of the TLC block or the QLC block, the data within the TLC block may be seriously degraded in a short time. Therefore, in order to avoid the read disturbance causing difficulties in subsequent data decoding, a flash memory controller will move the data within the TLC/QLC block to another block, causing system performance degradation.

In addition, the data within the TLC/QLC block suffering the read disturbance issue is generally moved to another TLC/QLC block, the situation that causes that the read disturbance issue will quickly occur on the new TLC block, and the flash memory controller will move the data to a new block again.

SUMMARY OF THE INVENTION

It is therefore an objective of the present invention to provide a control method of a flash memory controller, which can improve the read disturbance phenomenon of the flash memory module, to solve the above-mentioned problems.

According to one embodiment of the present invention, a control method of a flash memory controller is disclosed, wherein the flash memory controller is configured to access a flash memory module, the flash memory module comprises a plurality of blocks, each of the plurality of blocks comprises a plurality of pages, and the control method comprises the steps of: selecting a first block; reading at least a portion of the pages of the first block and determining a bit error rate or a bit error count of each page; for each of the at least the portion of the pages of the first block, if the bit error rate or the bit error count of the page is not greater than a first threshold value, moving the data of the page into a second block; and for each of the at least the portion of the pages of the first block, if the bit error rate or the bit error count of the page is greater than the first threshold value, moving the data of the page into a third block; wherein a number of pages corresponding to a word line of the second block is less than a number of pages corresponding to a word line of the third block.

According to another embodiment of the present invention, a flash memory controller is disclosed, wherein the flash memory controller is configured to access a flash memory module, the flash memory module comprises a plurality of blocks, each of the plurality of blocks comprises a plurality of pages, and the flash memory controller comprises a read only memory (ROM) arranged to store a program code and a microprocessor configured to execute the program code to control the access of the flash memory module. In addition, the microprocessor is configured to select a first block, read at least a portion of the pages of the first block and determining a bit error rate or a bit error count of each page; and for each of the at least the portion of the pages of the first block, if the bit error rate or the bit error count of the page is not greater than a first threshold value, the microprocessor moves the data of the page into a second block; and for each of the at least the portion of the pages of the first block, if the bit error rate or the bit error count of the page is greater than the first threshold value, the microprocessor moves the data of the page into a third block; and a number of pages corresponding to a word line of the second block is less than a number of pages corresponding to a word line of the third block.

According to another embodiment of the present invention, an electronic device comprising a flash memory module and a flash memory controller is disclosed. The flash memory module comprises a plurality of blocks, and each of the plurality of blocks comprises a plurality of pages. The flash memory controller is configured to select a first block, and read at least a portion of the pages of the first block and determining a bit error rate or a bit error count of each page; and for each of the at least the portion of the pages of the first block, if the bit error rate or the bit error count of the page is not greater than a first threshold value, the flash memory controller moves the data of the page into a second block; and for each of the at least the portion of the pages of the first block, if the bit error rate or the bit error count of the page is greater than the first threshold value, the flash memory controller moves the data of the page into a third block; and a number of pages corresponding to a word line of the second block is less than a number of pages corresponding to a word line of the third block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 shows a read count table according to one embodiment of the present invention.

DETAILED DESCRIPTION

Figure 1:
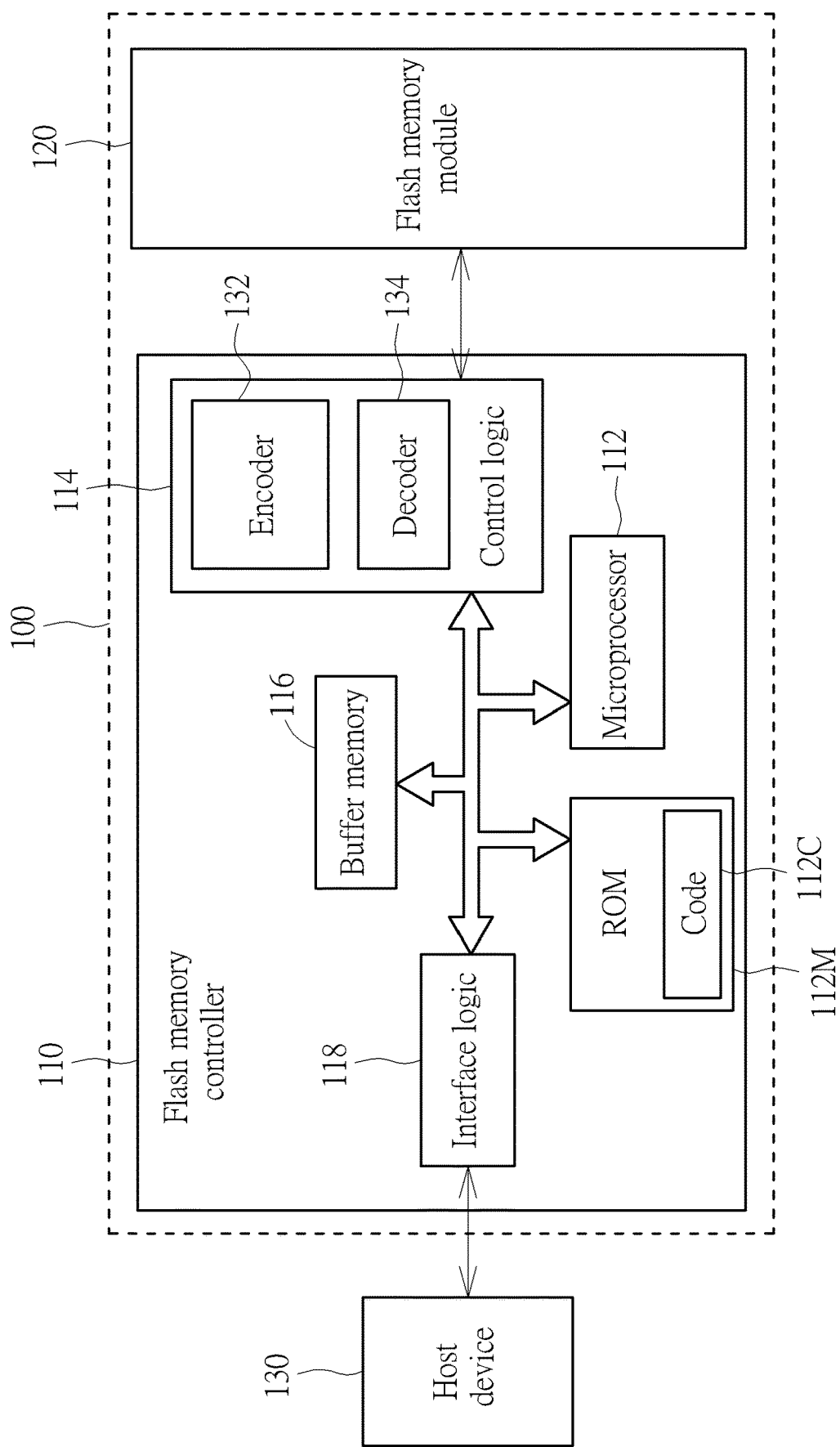
FIG. 1 is a diagram illustrating an electronic device according to an embodiment of the present invention.

FIG. 1 is a diagram illustrating an electronic device 100 according to an embodiment of the present invention. The electronic device 100 includes a flash memory module 120 and a flash memory controller 110. The flash memory controller 110 is configured to access the flash memory module 120. According to the present embodiment, the flash memory controller 110 includes a microprocessor 112, a read only memory (ROM) 112M, a control logic 114, a buffer memory 116 and an interface logic 118. The read only memory 112M is configured to store a code 112C, and the microprocessor 112 is configured to execute the code 112C to control access of the flash memory module 120. The control logic 114 includes an encoder 132 and a decoder 134, wherein the encoder 132 is configured to encode data which is written in the flash memory module 120 to generate a corresponding check code (also known as an error correction code (ECC)), and the decoder 134 is configured to decode data read from the flash memory module 120.

In a general situation, the flash memory module 120 includes a plurality of flash memory chips, and each flash memory chip includes a plurality of blocks. The flash memory controller 110 performs a block-based erase operation upon the flash memory module 120. In addition, a block can record a specific number of pages, wherein the flash memory controller 110 performs a page-based write operation upon the flash memory module 120. In the present embodiment, the flash memory module 120 is a 3D NAND-type flash memory module.

Specifically, through the microprocessor 112 executing the code 112C, the flash memory controller 110 may use its own internal components to perform many control operations. For example, the flash memory controller 110 uses the control logic 114 to control access of the flash memory module 120 (especially access of at least one block or at least one page), uses the buffer memory 116 to perform a required buffering operation, and uses the interface logic 118 to communicate with a host device 130. The buffer memory 116 is implemented by a random access memory (RAM). For example, the buffer memory 116 may be a static RAM (SRAM), but the present invention is not limited thereto.

In one embodiment, the electronic device 100 may be a portable memory device such as a memory card which conforms to one of the SD/MMC, CF, MS and XD specifications, and the host device 130 is another electronic device able to be connected to the electronic device 100, such as a cellphone, a laptop, a desktop computer, etc. In another embodiment, the electronic device 100 may be a solid state drive (SSD) or an embedded memory device which conforms to the universal flash storage (UFS) specification or embedded Multi Media Card (EMMC) specification, and can be arranged in a cellphone, a laptop or a desktop computer. At this time, the host device 130 can be a processor of the cellphone, a processor of the laptop or a processor of the desktop computer.

Figure 2:
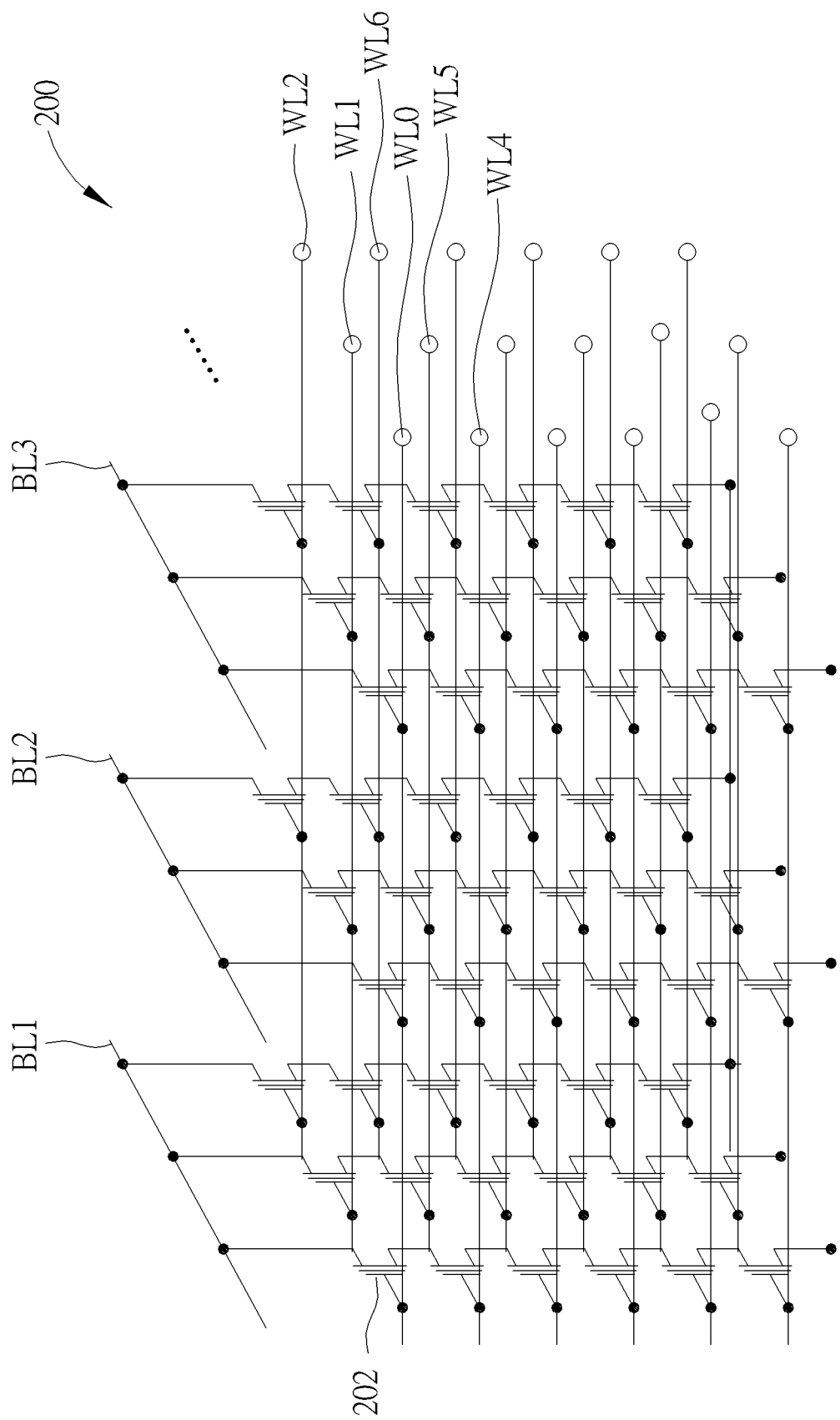
FIG. 2 is a diagram illustrating a block of a flash memory module according to an embodiment of the present invention.

FIG. 2 is a diagram illustrating a block 200 of the flash memory module 120 according to an embodiment of the present invention, wherein the flash memory module 120 is a 3D NAND-type flash memory module. As shown in FIG. 2, the block 200 includes a plurality of memory cells, such as floating gate transistors 202 shown in FIG. 2 or other charge trapping components. A 3D NAND-type flash memory structure is formed through a plurality of bit lines (only BL1-BL3 are shown in FIG. 2) and a plurality of word lines (e.g., WL0-WL2 and WL4-WL6 shown in FIG. 2). Taking a top plane in FIG. 2 as an example, all floating gate transistors on the word line WL0 form at least one page, all floating gate transistors on the word line WL1 form at least another one page, and so on. In addition, the definition between the word line WL0 and the page (logic page) may vary depending on a writing method of the flash memory. In detail, when data are stored using a single-level cell (SLC) means, all floating gate transistors on the word line WL0 correspond to only one logic page; when data are stored using a multi-level cell (MLC) means, all floating gate transistors on the word line WL0 correspond to two logic pages; when data are stored using a TLC means, all floating gate transistors on the word line WL0 correspond to three logic pages; and when data are stored using a QLC means, all floating gate transistors on the word line WL0 correspond to four logic pages. The 3D NAND-type flash memory structure and the relationship between word lines and pages are obvious to those skilled in the art. For simplification, no further illustration is provided.

Figure 3:
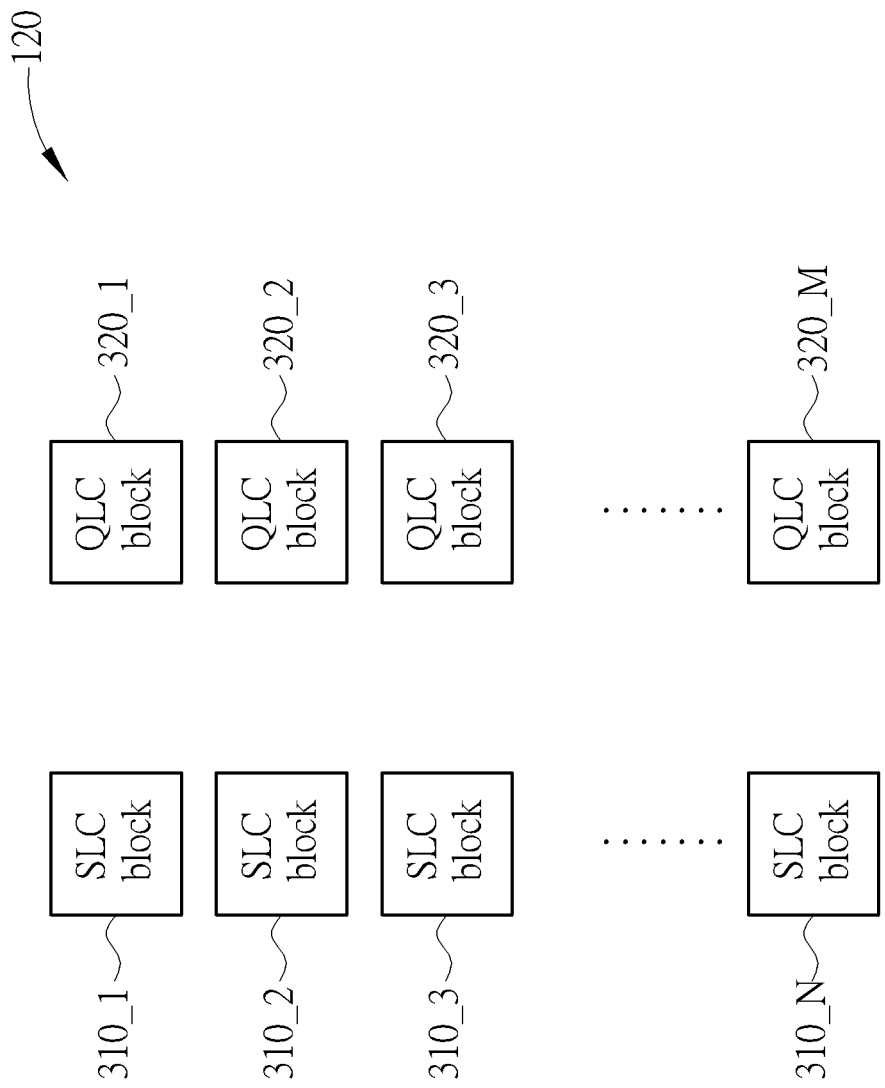
FIG. 3 shows that the flash memory module comprises a plurality of first blocks and a plurality of second blocks.

In this embodiment, the flash memory module 120 comprises different types of blocks. Taking FIG. 3 as an example, the flash memory module 120 comprises a plurality of first blocks and a plurality of second blocks, wherein the first blocks are SLC blocks 310_1-310_N, and the second blocks are TLC blocks or QLC blocks (QLC blocks 320_1-320_M serves as the second blocks in this embodiment). In addition, every time when the flash memory controller 110 receives a read command from the host device 130, the microprocessor 112 will update a read count table stored in the buffer memory 116, wherein the read count table stores a read count of each block within the flash memory module 120, for determining if any block may suffer the read disturbance issue. Specifically, FIG. 4 shows a read count table 400 according to one embodiment of the present invention. As shown in FIG. 4, the read count table 400 records the block numbers and corresponding read counts, and if the host device sends a read command to ask for reading data of one or more pages of a specific block, the microprocessor 112 will update the read count table 400 to increase the read count of the specific block by one. For example, if the host device 130 sends a read command to read data of one or more pages of the QLC block 320_1, the microprocessor 112 will update the read count of the QLC block 320_1 from "4000" to "4001". In addition, if the block is empty (i.e., blank block), the corresponding read count is zero or invalid number.

As described in the background of the present invention, the TLC/QLC block will suffer the serious read disturbance issue if the TLC/QLC block is often read by the host device 130 or the flash memory controller 110. In addition, after many tests performed on certain types of flash memory modules, the inventor found that if one logical page of a word line is often read by the flash memory controller 110, the quality of the one logical page is not worsened, but the quality of the other logical pages of the same word line are seriously degraded, even if the other logical pages of the same word line are not often read by the flash memory controller 110. To solve this problem, a flowchart of a control method of the flash memory controller 110 shown in FIG. 5A and FIG. 5B is provided according to one embodiment of the present invention.

Figure 5A:
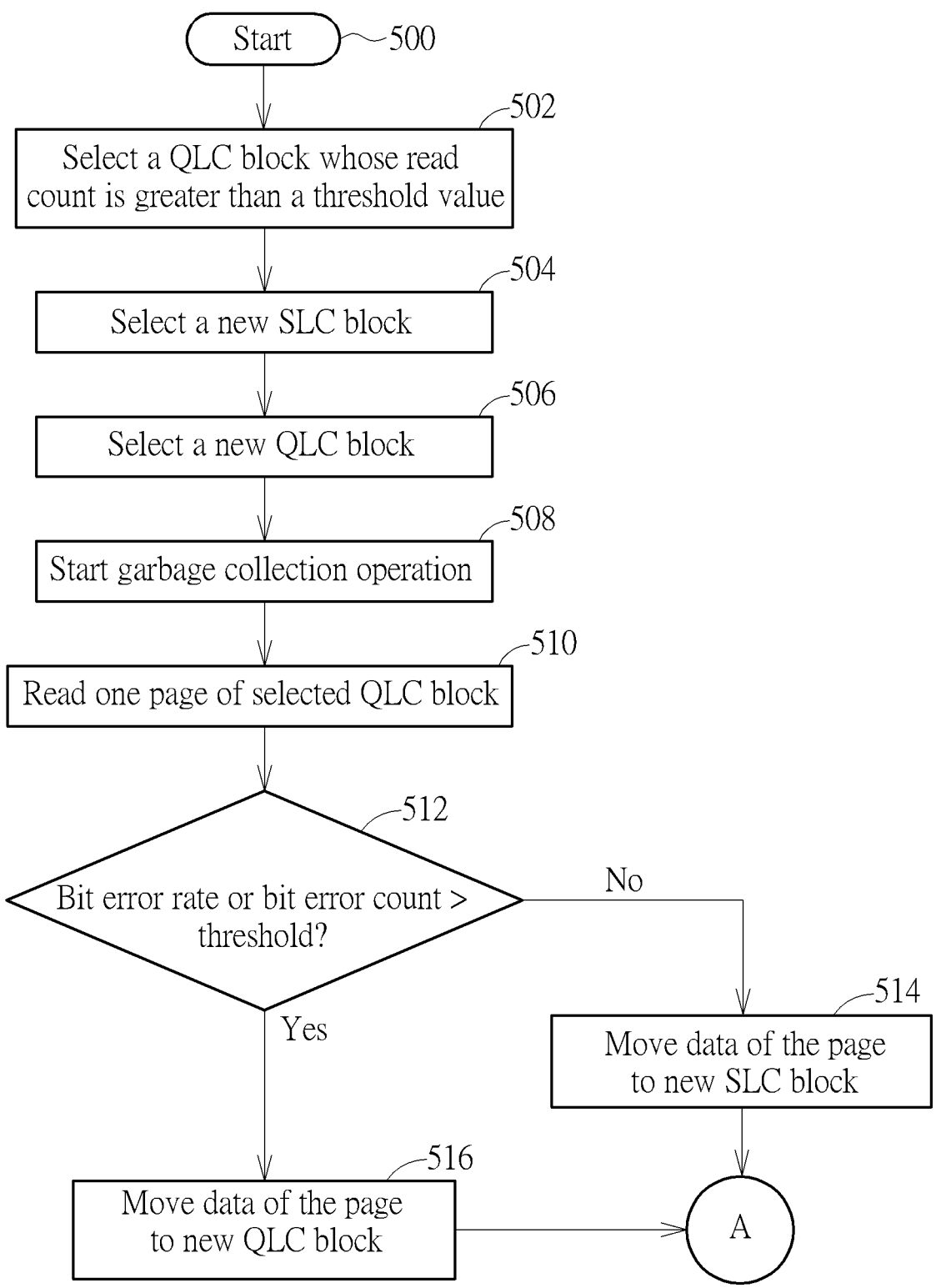
FIG. 5A and FIG. 5B show a flowchart of a control method of the flash memory controller 110 according to one embodiment of the present invention.
Figure 5B:
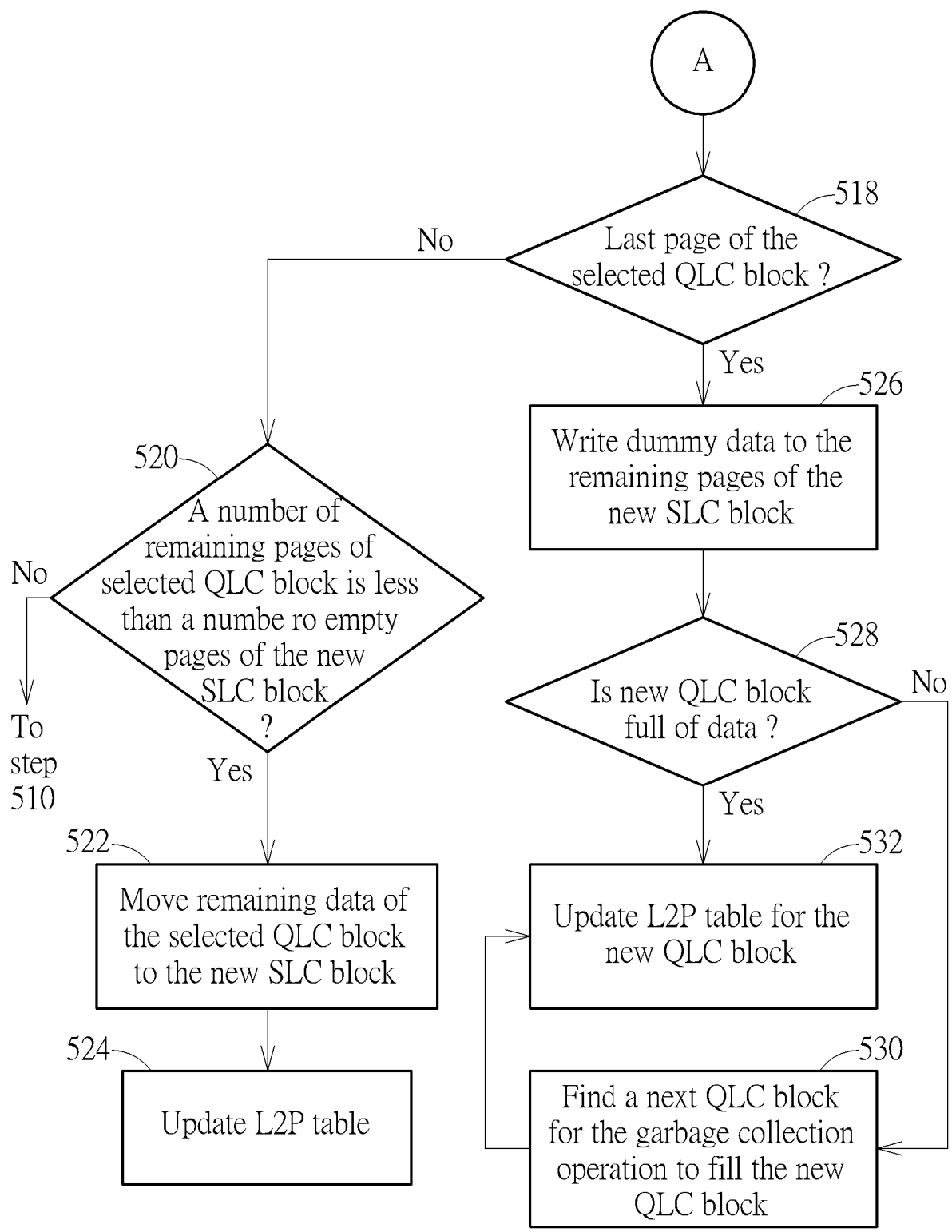

As shown in FIG. 5A and FIG. 5B, in Step 500, the flow starts, and the electronic device 100 is powered on. In Step 502, the microprocessor 112 refers to the read count table 400 to determine in any QLC block whose read count is greater than a threshold value, and if yes, the microprocessor 112 selects a QLC block whose read count is greater than the threshold value; and if not, no QLC block is selected, and the flow stays at Step 502. In this embodiment, the QLC block 320_1 is selected. In Step 504, the microprocessor 112 selects a new SLC block, wherein the new SLC block may be a blank block, and the SLC block 310_2 serves as the new SLC block in this embodiment. In Step 506, the microprocessor 112 selects a new QLC block, wherein the new QLC block may be a blank block, and the QLC block 320_2 serves as the new QLC block in this embodiment. In Step 508, the microprocessor 122 starts to perform a garbage collection operation on the selected QLC block 320_1, that is to move the valid data of the QLC block 320_1 into other blocks, and then the QLC block 320_1 is erased to be a blank block.

In Step 510, the microprocessor 112 reads data of one valid page of the QLC block 320_1. Initially, the flash memory controller 110 reads data of a first valid page of the QLC block 320_1. In this embodiment, the valid page means that the data of this page is valid; and an invalid page means that the data of this page is invalid, for example, the data may be old data (i.e., data before the update), and the updated data with the same logical address is stored in another page or another block. In Step 512, the decoder 134 decodes the data to generate decoded data and determine a bit error rate or a bit error count of the page, and the microprocessor 112 determines if the bit error rate or the bit error count is greater than a threshold value, if yes, the flow enters Step 516; and if not, the flow enters Step 514. Specifically, in one embodiment, the decoder 134 can directly uses a low-density parity-check (LDPC) decoding method to decode the data of each sector/chunk of the page to generate the decoded data, and records the bit error rate or the bit error count of the page, wherein the decoded data can be temporarily stored in the buffer memory 116. In another example, the decoder 134 may use a Bose-Chaudhuri-Hocquenghem (BCH) decoding method to decode the data first, if the decoding step succeeds, storing the decoded data and the corresponding bit error rate or bit error count into the buffer memory 116; if the decoding step fails, the decoder 134 uses the LDPC decoding method to decode the data, and stores the decoded data and the corresponding bit error rate or bit error count into the buffer memory 116.

In Step 514, if the bit error rate or the bit error count is not greater than the threshold value, the microprocessor 112 writes the decoded data temporarily stored in the buffer memory 116 into the SLC block 310_2, that is the encoder 132 encodes the decoded data to generate encoded data comprising the original data and ECC, and writes the encoded data into the SLC block 310_2.

In Step 516, if the bit error rate or the bit error count is greater than the threshold value, the microprocessor 112 writes the decoded data temporarily stored in the buffer memory 116 into the QLC block 320_2, that is the encoder 132 encodes the decoded data to generate encoded data comprising the original data and ECC, and writes the encoded data into the QLC block 320_2.

In Step 518, the microprocessor 518 determines if the page read in Step 510 is the last page of the QLC block 320_1, if yes, the flow enters Step 526; and if not, the flow enters Step 520. In Step 520, the microprocessor 112 determines if a number the remaining valid pages (logical pages) of the QLC block 320_1 is less than a number of empty pages of the SLC block, wherein the remaining valid pages are the pages that have not been read and decoded in this garbage collection operation; and if yes, the flow enters Step 522; and if not, the flow goes back to Step 510 to read a next valid page of the QLC block 320_1.

In Step 522, the microprocessor 112 moves data of all the remaining pages of the QLC block 320_1 into the SLC block 310_2. Specifically, the microprocessor 112 sequentially reads data of the remaining valid pages of the QLC block 320_1, and writes the data into the SLC 310_2. In Step 524, the microprocessor 112 updates a logical address to physical address (L2P) mapping table for the data moved from the QLC block 320_1 to the SLC block 310_2. At this time, the garbage collection operation of the QLC block 320_1 has been completed, and the QLC block 320_1 can be erased in an appropriate time to become a blank block.

In addition, after Step 522 or Step 524, the SLC block 310_2 can be used to store data of another QLC block in the garbage collection operation, or the microprocessor 112 can write invalid data or dummy data into all of the remaining pages of the SLC block 310_2 to stabilize the quality of the SLC block 310_2.

In Step 526, the microprocessor 112 writes invalid data or dummy data into all of the remaining pages of the SLC block 310_2 to stabilize the quality of the SLC block 310_2. In Step 528, the microprocessor 112 determines if the QLC block 320_2 is full of data (i.e., all of the pages are written), if yes, the flow enters Step 532; and if not, the flow enters Step 530. In Step 530, the microprocessor 112 finds one or more other QLC blocks (e.g., the QLC block whose read count is greater than the threshold value) to perform another garbage collection operation, to move the valid data of the other QLC block (s) into the remaining pages of the QLC block 320_2 to fill the QLC block 320_2, and the flow enters Step 532. In Step 532, the microprocessor 112 updates a L2P mapping table for the QLC block 320_2.

It is noted that the Step 526 is optional, that is the microprocessor 112 may not write invalid data or dummy data into all of the remaining pages of the SLC block 310_2, and the SLC block 310_2 can be used to store other data from the host device 130 or the other blocks.

Briefly summarized, in the embodiments of the present invention, by moving the data with lower bit error ratio or lower bit error count (i.e., the data may be often read by the flash memory controller 110) into the SLC block 310_2, the read disturbance phenomenon can be improved because memory cells of a word line of the SLC block only stores data of one logical page. In addition, by moving the data with higher bit error ratio or higher bit error count (i.e., the data may not be often read by the flash memory controller 110) into the QLC block 320_2, the storage density of the flash memory module 120 can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method of a flash memory controller, wherein the flash memory controller is configured to access a flash memory module, the flash memory module comprises a plurality of blocks, each of the plurality of blocks comprises a plurality of pages, and the control method comprises the steps of:
   selecting a first block;
   reading at least a portion of the pages of the first block and determining a bit error rate or a bit error count of each page;
   for each of the at least the portion of the pages of the first block, if the bit error rate or the bit error count of the page is not greater than a first threshold value, moving the data of the page into a second block; and
   for each of the at least the portion of the pages of the first block, if the bit error rate or the bit error count of the page is greater than the first threshold value, moving the data of the page into a third block;
   wherein a number of pages corresponding to a word line of the second block is less than a number of pages corresponding to a word line of the third block.

2. The control method of claim 1, wherein the second block is a single-level cell (SLC) block, and the third block is a triple-level cell (TLC) block or a quad-level cell (QLC) block.

3. The control method of claim 2, wherein the first block is a TLC block or a QLC block.

4. The control method of claim 1, wherein the step of selecting the first block comprises:
referring to a read count table to find one block whose read count is greater than a second threshold value;
determining the block whose read count is greater than the second threshold value to serve as the first block.

5. The control method of claim 1, further comprising:
for remaining pages following the portion of the pages, determining if a number the remaining pages of the first block is less than a number of empty pages of the second block to generate a determination result; and
if the determination result indicates that the number the remaining pages of the first block is less than the number of the empty pages of the second block, directly moving data of the remaining pages of the first block into the second block.

6. The control method of claim 5, further comprising:
after the data of the remaining pages of the first block is moved into the second block, writing invalid data or dummy data into all of the empty pages of the second block.

7. The control method of claim 1, further comprising:
after all of the data of the first block is moved to the second block and/or the third block, writing invalid data or dummy data into all of the empty pages of the second block.

8. A flash memory controller, wherein the flash memory controller is configured to access a flash memory module, the flash memory module comprises a plurality of blocks, each of the plurality of blocks comprises a plurality of pages, and the flash memory controller comprises:
a read only memory (ROM), arranged to store a program code;
a microprocessor, configured to execute the program code to control the access of the flash memory module;
wherein the microprocessor is configured to select a first block, read at least a portion of the pages of the first block and determining a bit error rate or a bit error count of each page;
and for each of the at least the portion of the pages of the first block, if the bit error rate or the bit error count of the page is not greater than a first threshold value, the microprocessor moves the data of the page into a second block;
and for each of the at least the portion of the pages of the first block, if the bit error rate or the bit error count of the page is greater than the first threshold value, the microprocessor moves the data of the page into a third block;
and a number of pages corresponding to a word line of the second block is less than a number of pages corresponding to a word line of the third block.

9. The flash memory controller of claim 8, wherein the second block is a single-level cell (SLC) block, and the third block is a triple-level cell (TLC) block or a quad-level cell (QLC) block.

10. The flash memory controller of claim 9, wherein the first block is a TLC block or a QLC block.

11. The flash memory controller of claim 8, wherein the microprocessor refers to a read count table to find one block whose read count is greater than a second threshold value, and determines the block whose read count is greater than the second threshold value to serve as the first block.

12. The flash memory controller of claim 8, wherein for remaining pages following the portion of the pages, the microprocessor determines if a number the remaining pages of the first block is less than a number of empty pages of the second block to generate a determination result; and if the determination result indicates that the number the remaining pages of the first block is less than the number of the empty pages of the second block, the microprocessor directly moves data of the remaining pages of the first block into the second block.

13. The flash memory controller of claim 12, wherein after the data of the remaining pages of the first block is moved into the second block, the microprocessor writes invalid data or dummy data into all of the empty pages of the second block.

14. The flash memory controller of claim 8, wherein after all of the data of the first block is moved to the second block and/or the third block, the microprocessor writes invalid data or dummy data into all of the empty pages of the second block.

15. An electronic device, comprising:
a flash memory module, where the flash memory module comprises a plurality of blocks, and each of the plurality of blocks comprises a plurality of pages; and
a flash memory controller, configured to select a first block, and read at least a portion of the pages of the first block and determining a bit error rate or a bit error count of each page; and for each of the at least the portion of the pages of the first block, if the bit error rate or the bit error count of the page is not greater than a first threshold value, the flash memory controller moves the data of the page into a second block; and for each of the at least the portion of the pages of the first block, if the bit error rate or the bit error count of the page is greater than the first threshold value, the flash memory controller moves the data of the page into a third block; and a number of pages corresponding to a word line of the second block is less than a number of pages corresponding to a word line of the third block.

16. The electronic device of claim 15, wherein the second block is a single-level cell (SLC) block, and the third block is a triple-level cell (TLC) block or a quad-level cell (QLC) block.

17. The electronic device of claim 16, wherein the first block is a TLC block or a QLC block.

18. The electronic device of claim 15, wherein the flash memory controller refers to a read count table to find one block whose read count is greater than a second threshold value, and determines the block whose read count is greater than the second threshold value to serve as the first block.

19. The electronic device of claim 15, wherein for remaining pages following the portion of the pages, the flash memory controller determines if a number the remaining pages of the first block is less than a number of empty pages of the second block to generate a determination result; and if the determination result indicates that the number the remaining pages of the first block is less than the number of the empty pages of the second block, the flash memory controller directly moves data of the remaining pages of the first block into the second block.

20. The electronic device of claim 19, wherein after the data of the remaining pages of the first block is moved into the second block, the flash memory controller writes invalid data or dummy data into all of the empty pages of the second block.

* * * * *